US012655946B2

(12) United States Patent
Van Bommel et al.

(10) Patent No.: US 12,655,946 B2
(45) Date of Patent: Jun. 16, 2026

(54) LED FILAMENT

(71) Applicant: SIGNIFY HOLDING B.V., Eindhoven (NL)

(72) Inventors: Ties Van Bommel, Horst (NL); Lambert Johannes Stil, Helmond (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/862,250

(22) PCT Filed: Apr. 21, 2023

(86) PCT No.: PCT/EP2023/060487
§ 371 (c)(1),
(2) Date: Nov. 1, 2024

(87) PCT Pub. No.: WO2023/213575
PCT Pub. Date: Nov. 9, 2023

(65) Prior Publication Data
US 2025/0277567 A1 Sep. 4, 2025

(30) Foreign Application Priority Data

May 3, 2022 (EP) .................................... 22171252

(51) Int. Cl.
*H10H 20/854* (2025.01)
*F21K 9/232* (2016.01)
(Continued)

(52) U.S. Cl.
CPC ........... *F21K 9/232* (2016.08); *H10H 20/841* (2025.01); *H10H 20/854* (2025.01);
(Continued)

(58) Field of Classification Search
CPC ......................... H01L 25/0753; H10H 20/841; H10H 20/854; H10H 20/857; H10H 20/852;
(Continued)

(56) References Cited

U.S. PATENT DOCUMENTS

2014/0268740 A1* 9/2014 Veres .................... F21V 19/002
362/249.06

FOREIGN PATENT DOCUMENTS

CN 203892915 U 10/2014
CN 205606240 U 9/2016
(Continued)

*Primary Examiner* — Omar Rojas Cadima

(57) ABSTRACT

A light emitting diode, LED, filament (1) configured to, in operation, emit LED filament light (22), the LED filament (1) comprising an array of light emitting diodes (2), LEDs, comprising a plurality of LEDs (20) configured to, in operation, emit LED light (23), an electrical circuitry (19) coupled to the plurality of LEDs (20), a elongated carrier (3), the plurality of LEDs (20) being arranged on a first major surface (31) of the elongated carrier (3), an encapsulant (5) comprising a translucent material, the encapsulant (5) at least partially enclosing the plurality of LEDs (20) and the elongated carrier (3), and an at least partially reflective layer (4) being configured to being perceived by a viewer as being golden in color, being configured to one or more of at least partially transmit and at least partially reflect the LED light (23), and being at least arranged on the same side of the elongated carrier (3) as the plurality of LEDs (20).

14 Claims, 6 Drawing Sheets

(51) Int. Cl.
    H10H 20/841       (2025.01)
    H10H 20/857       (2025.01)
    H10W 90/00       (2026.01)
    *F21Y 103/10*       (2016.01)
    *F21Y 115/10*       (2016.01)

(52) U.S. Cl.
    CPC .......... H10H 20/857 (2025.01); H10W 90/00
        (2026.01); *F21Y 2103/10* (2016.08); *F21Y*
                            *2115/10* (2016.08)

(58) Field of Classification Search
    CPC .... H10H 20/851; H10H 20/8511; F21K 9/66;
        F21K 9/232; F21V 3/0625; F21V 3/0615;
            F21Y 2107/00; F21Y 2115/10; H05K
                         3/0058; H05K 3/284
    See application file for complete search history.

(56)                 References Cited

FOREIGN PATENT DOCUMENTS

| | | | |
|---|---|---|---|
| CN | 215335839 | U | 12/2021 |
| EP | 3316300 | A1 | 5/2018 |

* cited by examiner

LED FILAMENT

CROSS-REFERENCE TO PRIOR APPLICATIONS

This application is the U.S. National Phase application under 35 U.S.C. § 371 of International Application No. PCT/EP2023/060487, filed on Apr. 21, 2023, which claims the benefit of European Patent application Ser. No. 22/171, 252.4, filed on May 3, 2022. These applications are hereby incorporated by reference herein.

FIELD OF THE INVENTION

The present invention relates to a light emitting diode, LED, filament configured to, in operation, emit LED filament light in a direction of emission, the LED filament comprising an array of light emitting diodes, LEDs, comprising a plurality of LEDs configured to, in operation, emit LED light, an electrical circuitry coupled to the plurality of LEDs, an elongated carrier, the plurality of LEDs being arranged on a surface of the elongated carrier, and an encapsulant comprising a translucent material, the encapsulant at least partially enclosing the plurality of LEDs and the elongated carrier.

As used herein, the terms carrier and elongated carrier may be used interchangeably, such that the elongated carrier may also simply be denoted carrier.

BACKGROUND OF THE INVENTION

A current trend in lighting is the use of LED filament lamps. A LED filament lamp is a LED lamp which comprises a LED filament, and which is designed to resemble a traditional incandescent light bulb with a visible filament for aesthetic and light distribution purposes, but with the high efficiency of light-emitting diodes.

A LED filament is providing LED filament light and comprises a plurality of light emitting diodes (LEDs) arranged in a linear array. Preferably, the LED filament has a length L and a width W, wherein L>5W. The LED filament may be arranged in a straight configuration or in a non-straight configuration such as for example a curved configuration, a 2D/3D spiral or a helix. Preferably, the LEDs are arranged on an elongated carrier like for instance a carrier, that may be rigid (made from, e.g., a polymer, glass, quartz, metal or sapphire) or flexible (e.g., made of a polymer or metal, e.g., a film or foil).

In case the carrier comprises a first major surface and an opposite second major surface, the LEDs are arranged on at least one of these surfaces. The carrier may be reflective or light transmissive, such as translucent and preferably transparent.

The LED filament may comprise an encapsulant at least partly covering at least part of the plurality of LEDs. The encapsulant may also at least partly cover at least one of the first major surface and second major surface. The encapsulant may be a polymer material which may be flexible such as for example a silicone. Further, the LEDs may be arranged for emitting LED light e.g. of different colors or spectrums. The encapsulant may comprise a luminescent material that is configured to at least partly convert LED light into converted light. The luminescent material may be a phosphor such as an inorganic phosphor and/or quantum dots or rods. The phosphor may comprises a first phosphor providing green/yellow light and/or a second phosphor providing red light. The first phosphor may comprise YAG and/or LuAG. The second phosphor may comprise a KSiF phosphor.

The LED filament may comprise multiple sub-filaments.

CN 203892915 U discloses a linear LED light emitting device comprising a LED light source arranged on a transparent carrier made of glass. The carrier is provided with a transparent, fluorescent phosphor layer encapsulating the LED light source and a transparent, fluorescent phosphor layer on a side opposite to the LED light source. A reflective layer is provided on each side surface of the carrier, and thus extending between the two phosphor layers. The reflecting reflective layer is a reflective coating layer comprising at least one metal selected from gold, silver, aluminum, copper, nickel, iron and tin.

CN205606240U discloses a LED lamp with a bulb and a LED filament inside the bulb. The LED filament has a metal carrier with a golden coating material on top of the metal carrier.

It is desired to provide a LED filament providing improved decorative lighting and/or having an appearance which is improved (while still being highly efficient).

It is still further desired to provide such a LED filament which is also simple and cost efficient to produce.

SUMMARY OF THE INVENTION

Hence, it is an aspect of the invention to provide an alternative LED filament which preferably further at least partly obviate(s) one or more of above-described drawbacks. The present invention may have as object to overcome or ameliorate at least one of the disadvantages of the prior art, or to provide a useful alternative. The present invention may have as object to provide a LED filament providing improved decorative lighting and/or having an appearance which is improved (while still being highly efficient). The present invention may have as object to provide such a LED filament which is also simple and cost efficient to produce.

According to a first aspect of the invention, this and other objects are achieved by means of a light emitting diode, LED, filament configured to, in operation, emit LED filament light, the LED filament comprising an array of light emitting diodes, LEDs, comprising a plurality of LEDs configured to, in operation, emit LED light, an electrical circuitry coupled to the plurality of LEDs, an elongated carrier, the plurality of LEDs being arranged on a first major surface of the elongated carrier, an encapsulant comprising a translucent material, the encapsulant at least partially enclosing the plurality of LEDs and the elongated carrier, and an at least partially reflective layer, the at least partially reflective layer being configured to being perceived by a viewer as being golden in color, the at least partially reflective layer being configured to at least partially transmit and at least partially reflect the LED light, and the at least partially reflective layer being at least arranged on the same side of the elongated carrier as the plurality of LEDs.

Thereby, and in particular by providing an at least partially reflective layer configured to being perceived by a viewer as being golden in color, configured to one or more of at least partially transmit and at least partially reflect the LED light, and at least arranged on the same side of the elongated carrier as the plurality of LEDs, a LED filament is provided with which the decorative lighting and appearance of LED filaments is improved while still being highly efficient.

Furthermore, by providing that the at least partially reflective layer is configured to being perceived by a viewer as being golden in color and is arranged on the same side of the elongated carrier as the plurality of LEDs, a LED filament is provided which further has a golden appearance in both an on state and an off state, that is whether the plurality of LEDs emit LED light or not.

Such a LED filament further has a very simple structure and is cost efficient to produce.

In an embodiment, at least 60% of the LED light is transmitted through the at least partially reflective layer, more preferably at least 70% of the LED light may be transmitted through the at least partially reflective layer, most preferably at least 80% of the LED light may be transmitted through the at least partially reflective layer.

In embodiments, the at least partially reflective layer may have a metallic appearance.

In embodiments, the at least partially reflective layer may comprise a metal. The metal may comprise gold and/or copper. The metal may be a alloy.

In embodiments, the at least partially reflective layer may have an (average) transmission in a range from 30 to 70%, preferably in a range from 35 to 65%, more preferably in a range from 38 to 62%, most preferably in a range from 40 to 60%.

In embodiments, the at least partially reflective layer may have an (average) reflectance in a range from 30 to 70%, preferably in a range from 35 to 65%, more preferably in a range from 38 to 62%, most preferably in a range from 40 to 60%.

Thereby, the above advantages may be obtained while simultaneously not compromising the quality and intensity of the overall light output of the LED filament, that is of the LED filament light. This is especially useful in embodiments where the at least partially reflective layer is arranged above the plurality of LEDs, such as on the LEDs or on the encapsulant.

In an embodiment, the at least partially reflective layer is configured to not conduct electricity or is electrically isolated.

Thereby, it is ensured that the at least partially reflective layer does not interfere with the functionality of any electrical components of the LED filament, such as the electrical circuitry. This in turn provides for a more secure LED filament.

In an embodiment, the LED filament has a LED filament circumference, and at least 80% of the LED filament circumference is covered by the at least partially reflective layer, preferably at least 85% of the LED filament circumference may be covered by the at least partially reflective layer, more preferably at least 90% of the LED filament circumference may be covered by the at least partially reflective layer, most preferably at least 95% of the LED filament circumference may be covered by the at least partially reflective layer.

Thereby, the LED filament is configured to be perceived by a viewer as being golden in color in a particularly uniform manner.

In an embodiment, the encapsulant further comprises a luminescent material configured to at least partially convert the LED light into converted light, wherein the at least partially reflective layer is configured to at least one of at least partly transmit and at least partly reflect the converted light, preferably at least 60% of the converted light may be transmitted through the at least partially reflective layer, more preferably at least 70% of the converted light may be transmitted through the at least partially reflective layer, preferably at least 80% of the converted light may be transmitted through the at least partially reflective layer.

Thereby, a LED filament providing a light output with an improved quality and with which the filament-like appearance remains visible is obtained.

The term "luminescent material" herein especially relates to inorganic luminescent materials. Luminescent materials may also be referred to as phosphors. These terms are known to the person skilled in the art.

In embodiments, quantum dots may be applied as luminescent material, and may optionally be embedded in transmissive matrices like e.g. polymers, like PMMA, or polysiloxanes, etc. etc. Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide (CuInS2) and/or silver indium sulfide (AgInS2) can also be used. Quantum dots show very narrow emission band and thus they show saturated colors. Furthermore, the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content. Instead of quantum dots or in addition to quantum dots, also other quantum confinement structures may be used. The term "quantum confinement structures" should, in the context of the present application, be understood as e.g. quantum wells, quantum dots, quantum rods, tripods, tetrapods, or nanowires, etcetera.

Especially, the luminescent material is configured to convert at least part of the LED light into luminescent material light having an emission band having wavelengths in one or more of (a) the green spectral wavelength range and (b) the yellow spectral wavelength range, wherein the luminescent material comprises a (garnet) luminescent material of the type A3B5O12:Ce, wherein A comprises one or more of Y, La, Gd, Tb and Lu, and wherein B comprises one or more of Al, Ga, In and Sc. Hence, the luminescent material light may e.g. green light or yellow light (or in specific embodiments even orange (dependent upon the composition of the garnet and cerium concentration)). However, other embodiments are also possible, see below. In embodiments, 0.05-10% of the A elements comprise Ce, even more especially 0.05-5%, such as 0.1-5%. Especially, embodiments, 0.1-3% of the A elements comprise Ce, such as up to 2%, like selected from the range of 0.1-1.5%, such as at least above 0.5%.

Alternatively or additionally, the luminescent material may e.g. be M2Si5N8:Eu2+ and/or MAlSiN3:Eu2+ and/or Ca2AlSi3O2N5:Eu2+, etc., wherein M comprises one or more of Ba, Sr and Ca, especially in embodiments at least Sr. In specific embodiments, the first luminescent may comprise one or more materials selected from the group consisting of (Ba,Sr,Ca)S:Eu, (Ba,Sr,Ca)AlSiN3:Eu and (Ba,Sr,Ca)2Si5N8:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by Eu2+). For instance, assuming 2% Eu in CaAlSiN3:Eu, the correct formula could be (Ca0.98Eu0.02)AlSiN3.

In an embodiment, the encapsulant is free from a luminescent material, and the encapsulant comprises a light scattering material configured to at least partially scatter the LED light into scattered light, wherein the at least partially reflective layer is configured to at least one of at least partly transmit and at least partly reflect the scattered light, preferably at least 60% of the scattered light may be transmitted through the at least partially reflective layer, preferably at least 70% of the scattered light may be transmitted through the at least partially reflective layer, preferably at least 80% of the scattered light may be transmitted through the at least partially reflective layer.

Thereby, a LED filament with a particularly directionally uniform light output is provided for.

In an embodiment, the at least partially reflective layer is provided on the encapsulant.

Thereby a LED filament being structurally very simple and further being simple to produce is provided for.

In an embodiment, the at least partially reflective layer is provided as a reflective coating on the plurality of LEDs.

Thereby a LED filament being structurally very simple is provided for.

In an embodiment, the at least partially reflective layer is provided on a surface of the elongated carrier on which the plurality of LEDs is arranged covering at least 60% of the carrier, preferably at least 70% of the carrier, more preferably at least 80% of the carrier, most preferably at least 90% of the carrier.

Thereby a LED filament being structurally very simple and furthermore very simple to produce is provided for.

In an embodiment, the at least partially reflective layer is provided on the same side of the elongated carrier as the plurality of LEDs and between the elongated carrier and an electrically insulating reflective layer.

Thereby, it is ensured that the at least partially reflective layer is electrically insulated from any electrical components of the LED filament, such as the electrical circuitry.

This in turn provides for a more secure LED filament.

In an embodiment, the at least partially reflective layer is provided on the carrier around the plurality of LEDs covering at least 60% of the carrier, preferably at least 70% of the carrier, more preferably at least 80% of the carrier, most preferably at least 90% of the carrier.

Thereby a LED filament being structurally particularly simple is provided for.

In an embodiment, the at least partially reflective layer is provided on the encapsulant or as a foil or a tube arranged around the encapsulant. Especially, the foil or tube may be attached, such as glued, to the encapsulant of the LED filament.

Thereby a LED filament being especially easy and simple to produce is provided for.

In an embodiment, the elongated carrier is a transparent elongated carrier, and the at least partially reflective layer is arranged on the opposite side of the elongated carrier as the plurality of LEDs. More particularly, the at least partially reflective layer is provided on a side or second major surface of the elongated carrier extending opposite to and parallel with the first major surface of the elongated carrier on which the LED filament light source is arranged.

Thereby, the LED filament is configured to being perceived by a viewer as being golden in color in a particularly uniform manner.

In an embodiment, the at least partially reflective layer comprises a reflectivity of 30-40% for light with a wavelength of less than 490 nm, a reflectivity of more than 80% for light with a wavelength of more than 600 nm, and a reflectivity increasing gradually with the wavelength for light with a wavelength of between 490 nm and 600 nm.

Such a combination of reflectivity in dependence of the wavelength of light has proved to provide a particularly golden appearance, that is an appearance resembling that of gold particularly well.

In an embodiment, the surface of the LED filament comprises a reflection of less than 30%.

This may be obtained by providing an encapsulant which is free from a luminescent material, and which comprises a suitably low concentration of light scattering material. Thereby, the light quality is improved.

In an embodiment, at least 70% of the first major surface of the elongated carrier is covered by the at least partially reflective layer.

Thereby, the LED filament is configured to being perceived by a viewer as being golden in color in a sufficiently uniform manner.

In an embodiment, the at least partially reflective layer is provided with a total reflectivity in the range of 20% to 60%.

Such a total reflectivity of the at least partially reflective layer has proved to provide a particularly golden appearance, that is an appearance resembling that of gold particularly well.

In an embodiment, the at least partially reflective layer is provided as particles or flakes, in a polymer binder or a transparent polymer binder or a silicone.

Since polymer binders, transparent polymer binders and in particular silicones are able to withstand high intensity light and heat, this provides for a particularly durable LED filament.

In an embodiment, the at least partially reflective layer is provided by use of vapor deposition.

Thereby, the at least partially reflective layer may be provided in a particularly simple and straight forward manner.

Such phosphors have been proved to be particularly well functioning when it is desired to obtain a golden appearance.

In an embodiment, a part of the elongated carrier is not covered by the encapsulant such as to ensure that at least a part of the at least partially reflective layer is free from the encapsulant.

Thereby, a LED filament is provided which in a structurally simple manner is brought to have an improved filament-like appearance due to the perceived difference between the part of the at least partially reflective layer covered by the encapsulant and the part of the at least partially reflective layer being free from the encapsulant, respectively.

In an embodiment, at least 40% of the surface area of the at least partially reflective layer is free from the encapsulant.

Thereby, a LED filament is provided which in a structurally simple manner is brought to have a particularly good filament-like appearance.

In an embodiment, the elongated carrier is curved.

When a surface of such a curved elongated carrier is provided with the at least partially reflective layer, a LED filament is obtained which has a quantitatively improved reflection and which provides LED filament light with an improved brightness.

In an embodiment, the LED filament further comprises a further array of light emitting diodes, LEDs, comprising a further plurality of LEDs configured to, in operation, emit further LED light, and a further electrical circuitry coupled to the further plurality of LEDs, the further plurality of LEDs being arranged on a second surface of the elongated carrier opposite to the first major surface, and a further at least partially reflective layer, the further at least partially reflective layer being configured to being perceived by a viewer as being golden in color, the further at least partially reflective layer being configured to one or more of at least partially transmit and at least partially reflect the further LED light, and the further at least partially reflective layer being at least arranged on the same side of the elongated carrier as the further plurality of LEDs.

Thereby, a LED filament is provided with which the decorative lighting and appearance of LED filaments, especially as being golden both in the on state and the off state is improved while still being highly efficient irrespective of the angle of view and applying to both pluralities of LEDs.

Such a LED filament may further provide a light output with an higher intensity and also has a very simple structure and is cost efficient to produce.

In an embodiment, the further at least partially reflective layer is configured to at least partly transmit and at least partly reflect the further LED light.

In an embodiment, the further at least partially reflective layer is configured to not conduct electricity or is electrically isolated.

In an embodiment, the LED filament has a LED filament circumference, wherein at least 80% of the LED filament circumference is covered by the at least partially reflective layer and the further at least partially reflective layer in total.

In an embodiment, the LED filament comprises a further encapsulant encapsulating the further LED filament light source.

In a further embodiment, the further encapsulant comprises a translucent material, and the further encapsulant at least partially encloses the further plurality of LEDs and the elongated carrier.

The encapsulant and the further encapsulant may be identical or mutually different.

In a further embodiment, the further encapsulant comprises a luminescent material configured to at least partially convert the further LED light into converted further light, and the further at least partially reflective layer is configured to at least one of at least partly transmit and at least partly reflect the converted further light.

In a further embodiment, the further encapsulant is free from a luminescent material, and the further encapsulant comprises a light scattering material configured to at least partially scatter the further LED light into scattered further light, wherein the further at least partially reflective layer configured to at least one of at least partly transmit and at least partly reflect the scattered further light.

In an embodiment, the further at least partially reflective layer is provided any one or more of as a reflective coating on the further plurality of LEDs, on a surface of the elongated carrier on which the further plurality of LEDs is arranged, on the same side of the elongated carrier as the plurality of further LEDs and underneath an electrically insulating reflective layer, on the elongated carrier around the further plurality of LEDs, and on or as a foil arranged around the further encapsulant.

In an embodiment, a part of the elongated carrier is not covered by the further encapsulant such as to ensure that at least a part of the further at least partially reflective layer is free from the further encapsulant.

In an embodiment, the at least partially reflective layer is arranged on the light emitting device in such a way that at least a part of or all of the at least partially reflective layer extends in parallel with the surface of the elongated carrier on which the plurality of LEDs are arranged.

In an embodiment, the further at least partially reflective layer is arranged on the light emitting device in such a way that at least a part of or all of the further at least partially reflective layer extends in parallel with the surface of the elongated carrier on which the further plurality of LEDs are arranged.

In embodiments, the LED filament light may be white light. The white light may have a correlated color temperature (CCT) in a range from 1800 to 5000 K, preferably in a range from 1800 to 4000 K, more preferably in a range from 1800 to 3000 K, most preferably in a range from 1800 to 2500 K which is the desired CCT range for LED filaments. The white light may have a color rendering index (CRI) of at least 80, preferably at least 85, more preferably at least 88, most preferably at least 90.

In embodiments, the at least partially reflective layer may be a layer and/or coating.

In embodiments, the LED filament may have a length L, a width W and a height H, wherein $L \geq 10W$ and/or $L \geq 10H$. Especially, L may be in a range from 3 to 10 cm, W may be in a range from 1 to 10 mm and/or H may be in a range from 1 to 10 mm.

In embodiments, the second major surface may comprise a further encapsulant. Especially, the further encapsulant may comprise a further luminescent material and/or a further light scattering material. Especially, the at least partially reflective layer may be arranged on the further encapsulant.

The invention also relates to a luminaire or a lamp comprising a LED filament according to the invention.

In an embodiment, such a lamp is a LED filament lamp comprising at least one LED filament according to the invention and a driver configured to power the plurality of LEDs via the circuitry of the LED filament.

In an embodiment, the LED filament lamp may further comprise a base for electrically and mechanically connecting the LED filament lamp to a socket of a luminaire.

In embodiments the lamp or luminaire may further comprise one or more of a controller, an antenna, and an envelope at least partly enveloping the LED filament.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of reflective layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
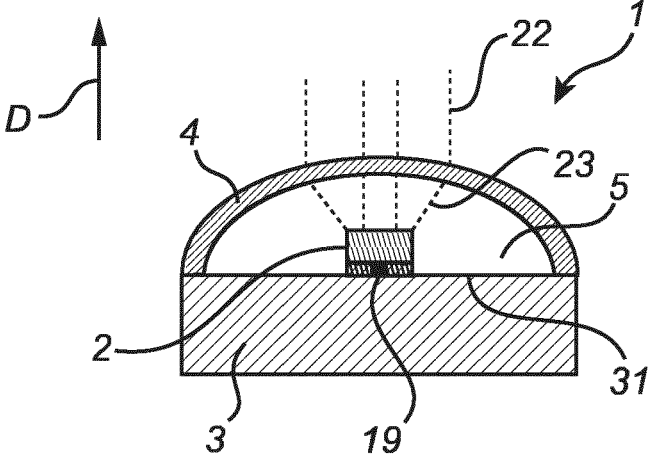
FIG. 1 shows a cross-sectional view of a LED filament according to a first embodiment of the invention.

FIG. 1 shows a cross-sectional view of a LED filament 1 according to a first embodiment of the invention. Generally, and irrespective of the embodiment, the LED filament 1 comprises an array of light emitting diodes, LEDs, 2, a carrier 3, an at least partially reflective layer 4, an encapsulant 5 and an electrical circuitry 19.

Figure 5:
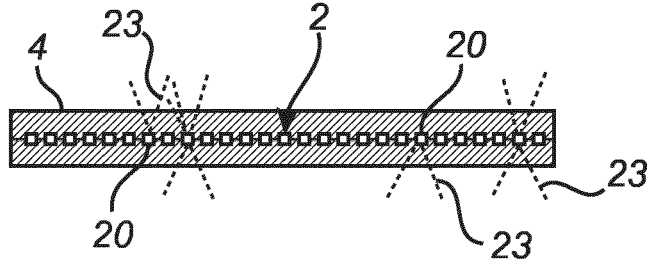
FIG. 5 shows a top view of a LED filament light source according to the invention and comprising a plurality of LEDs arranged on an elongated carrier provided with a reflective layer, the encapsulant being omitted.

The at least one LED filament 1 is configured to, in operation, emit LED filament light 22. The LED filament light 22 may be light of any suitable color, such as white. The LED filament 22 light may comprise one or more of the LED light, converted light and scattered light. The LED filament light 22 is emitted in a direction of emission D. Referring also to FIG. 5, the at least one LED filament 1 comprises an array of LEDs 2, the array of LEDs 2 comprising a plurality of LEDs 20. The plurality of LEDs 20 are configured to emit LED light 23. The LEDs 20 may be any suitable type of LEDs, such as for example white LEDs or a combination of red, green and blue LEDs. The plurality of LEDs 20 may comprise at least 5 LEDs, preferably at least 10 LEDs, more preferably at least 15 LEDs, most preferably at least 20 LEDs.

The plurality of LEDs 20 of the array of LEDs 2 of the LED filament 1 are arranged on a surface 31 of the carrier 3. The surface 31 is a first major surface 31 of the carrier 3. The carrier 3 is an elongated carrier 3. The elongated carrier 3 may be a substrate. The elongated carrier 3 or substrate may be a printed circuit board (PCB).

The electrical circuitry 19 is coupled to the plurality of LEDs 20 such as to supply the plurality of LEDs 20 with electrical energy. The electrical circuitry 19 is separate from the at least partially reflective layer 4. The electrical circuitry 19 may be arranged on or in the elongated carrier 3. The electrical circuitry 19 may comprise at least one first electrical track and at least one second electrical track.

The encapsulant 5 at least partially encloses the plurality of LEDs 20 and the elongated carrier 3. The encapsulant 5 comprises a translucent material. The translucent material of the encapsulant 5 may be a polymer, such as a silicone which is capable of withstanding high intensity light and heat.

The at least partially reflective layer 4 is generally, and irrespective of the embodiment, configured to be perceived by a viewer as being golden in color. The at least partially reflective layer 4 is partially transmissive or partially reflective or both for the LED light 23. The at least partially reflective layer 4 is configured to direct light away from the array of LEDs 2. The at least partially reflective layer 4 at least is arranged on or proximate to the same side 31 of the elongated carrier 3 as the plurality of LEDs 20. The LED filament 1 has a LED filament circumference. At least 80% of the LED filament circumference may be covered by the at least partially reflective layer 4.

Figure 11:
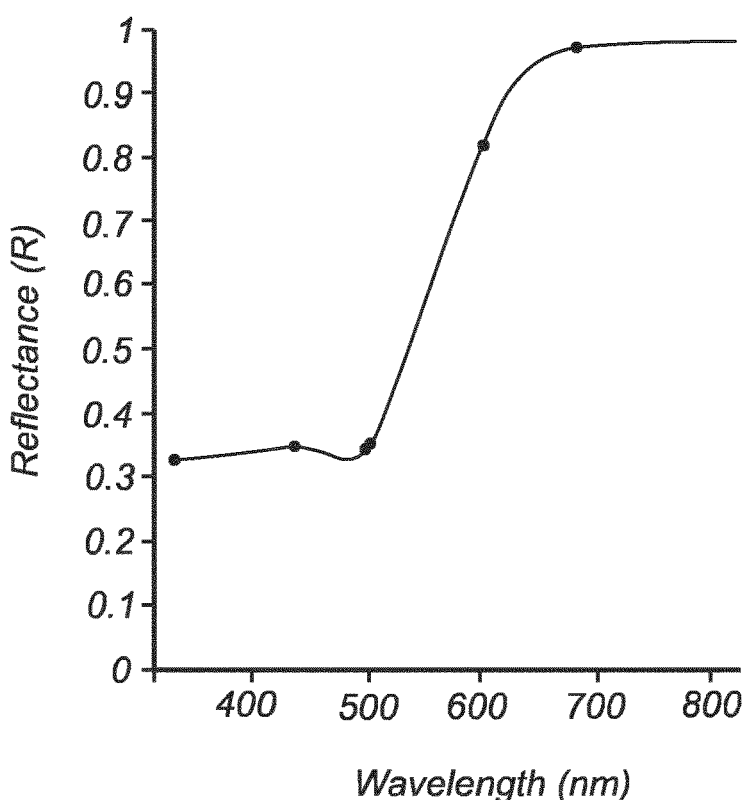
FIG. 11 shows a plot of the reflectance of a reflective layer of a LED filament according to the invention as a function of the wavelength of light incident on the at least partially reflective layer.

The at least partially reflective layer 4 comprises a reflectivity of 30-40% for light with a wavelength of less than 490 nm, that is for blue light. The at least partially reflective layer 4 comprises a reflectivity of more than 80% for light with a wavelength of more than 600 nm, that is for red light. Also, the at least partially reflective layer 4 comprises a reflectivity increasing gradually with the wavelength for light with a wavelength of between 490 nm and 600 nm, that is for green and yellow light. This is illustrated by way of an example in the plot of FIG. 11, showing the reflectance R of the at least partially reflective layer 4 as a function of wavelength of light incident on the at least partially reflective layer 4. The at least partially reflective layer 4 is free from a luminescent material. That is, the at least partially reflective layer 4 does not comprise any luminescent material. The at least partially reflective layer 4 further comprises a back-reflection of less than 30%.

The at least partially reflective layer 4 may be electrically non-conductive. That is, the at least partially reflective layer 4 may be configured such that is does not conduct electricity. The at least partially reflective layer 4 may be electrically isolated. The at least partially reflective layer 4 may be provided as particles or flakes in a polymer binder or in a transparent polymer binder or in a silicone. The at least partially reflective layer 4 may be provided by use of a vapor deposition procedure.

In the embodiment shown in FIG. 1, the at least partially reflective layer 4 is provided on the encapsulant 5. For instance, the at least partially reflective layer 4 may be provided as a foil arranged around the encapsulant 5 or as a coating on the encapsulant 5. 70% or more of the surface of the encapsulant 5 is covered by the at least partially reflective layer 4.

Figure 2:
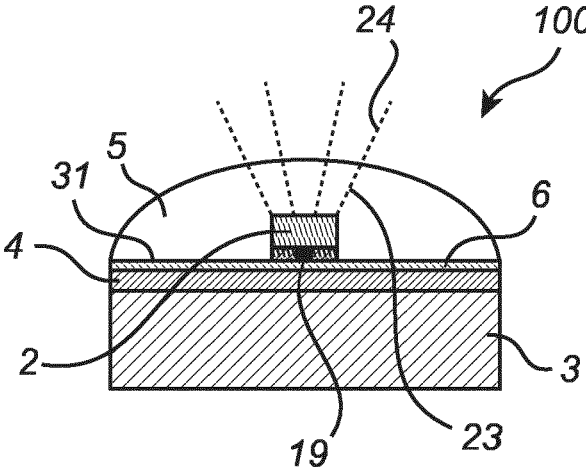
FIG. 2 shows a cross-sectional view of a LED filament according to a second embodiment of the invention.

FIG. 2 shows a cross-sectional view of a LED filament 100 according to a second embodiment of the invention. The LED filament 100 differs from the LED filament 1 described above in relation to FIG. 1 in virtue of the following features.

The at least partially reflective layer 4 is provided on the elongated carrier 3 below or underneath the array of LEDs 2 and further below or underneath an electrically insulating reflective layer 6. In this embodiment, the encapsulant 5 may in principle be omitted.

However, the LED filament 100 of FIG. 2 is shown comprising an encapsulant 5. The encapsulant 5 further comprises a luminescent material configured to at least partially convert the LED light 22 into converted light 24. The at least partially reflective layer 4 is further configured to at least partly transmit and/or at least partly reflect the converted light 24.

Figure 3:
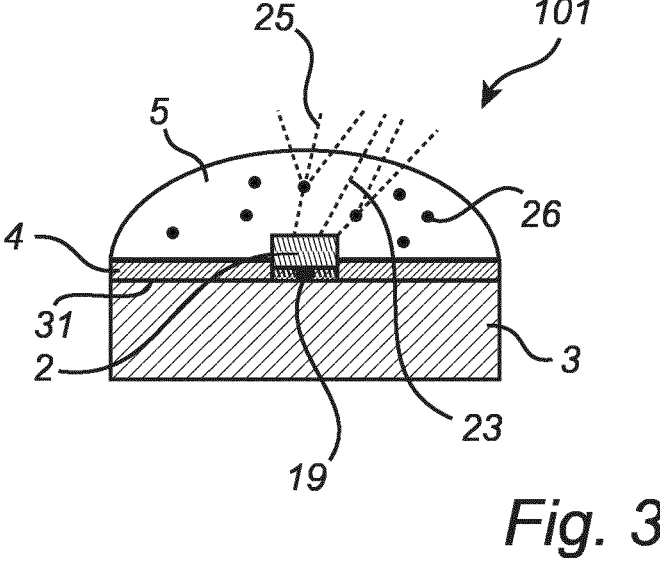
FIG. 3 shows a cross-sectional view of a LED filament according to a third embodiment of the invention.

FIG. 3 shows a cross-sectional view of a LED filament 101 according to a third embodiment of the invention. The LED filament 101 differs from the LED filaments described above in relation to FIGS. 1-2 in virtue of the following features.

The at least partially reflective layer 4 is provided on a surface 31 of the elongated carrier 3 on both sides of the LEDs 20 of the array of LEDs 2.

The encapsulant 5 is in this embodiment free from a luminescent material. The encapsulant 5 further comprises a light scattering material 26 configured to at least partially scatter the LED light 22 into scattered light 25. In such an embodiment, the at least partially reflective layer 4 may be configured to at least partly transmit and/or at least partly reflect the scattered light 25. The light scattering material 26 is on FIG. 3 shown as scattering particles but may also for instance be a coating on the encapsulant 5 or incorporated in the encapsulant 5.

Figure 4:
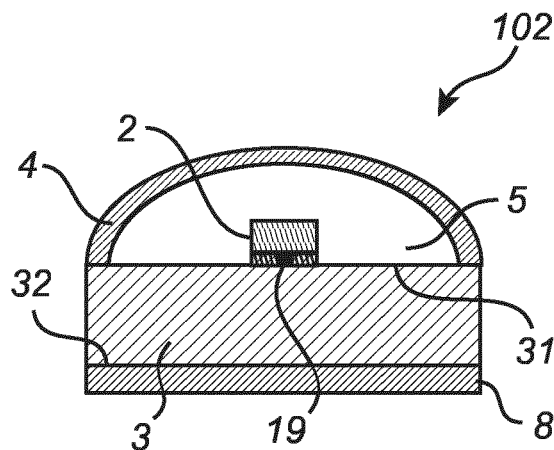
FIG. 4 shows a cross-sectional view of a LED filament according to a fourth embodiment of the invention.

FIG. 4 shows a cross-sectional view of a LED filament 102 according to a fourth embodiment of the invention. The LED filament 102 differs from the LED filaments described above in relation to FIGS. 1-3 in virtue of the following features.

The at least partially reflective layer 4 is provided on the encapsulant 5 in a manner similar to the embodiment described above with reference to FIG. 1. A further reflective layer 8 is provided on a further surface 32 of the elongated carrier 3 opposite to the surface 31 on which the array of LEDs 2 is arranged. The further surface 32 is a second major surface 32 extending opposite to the first major surface 31. The further at least partially reflective layer 8 is identical or similar to the at least partially reflective layer 4. In some embodiments of the type shown in FIG. 4, the at least partially reflective layer 4 provided on the encapsulant 5 may be omitted.

The further at least partially reflective layer 8 is generally, and irrespective of the embodiment, configured to being perceived by a viewer as being golden in color. The further at least partially reflective layer 8 is partially transmissive or partially reflective or both for the LED light. The further at least partially reflective layer 8 is configured to direct light away from the array of LEDs 2.

The further at least partially reflective layer 8 comprises a reflectivity of 30-40% for light with a wavelength of less than 490 nm, that is for blue light. The further at least partially reflective layer 8 comprises a reflectivity of more than 80% for light with a wavelength of more than 600 nm, that is for red light. Also, the further at least partially reflective layer 8 comprises a reflectivity increasing gradually with the wavelength for light with a wavelength of between 490 nm and 600 nm, that is for green and yellow light. The further at least partially reflective layer 8 is free from a luminescent material. That is, the further at least partially reflective layer 8 does not comprise any luminescent material. The further at least partially reflective layer 8 further comprises a back-reflection of less than 30%.

The further at least partially reflective layer 8 may be electrically non-conductive. The further at least partially reflective layer 8 may be provided as particles or flakes in a polymer binder or in a transparent polymer binder or in a silicone. The further at least partially reflective layer 8 may be provided by use of a vapor deposition procedure.

Figure 6:
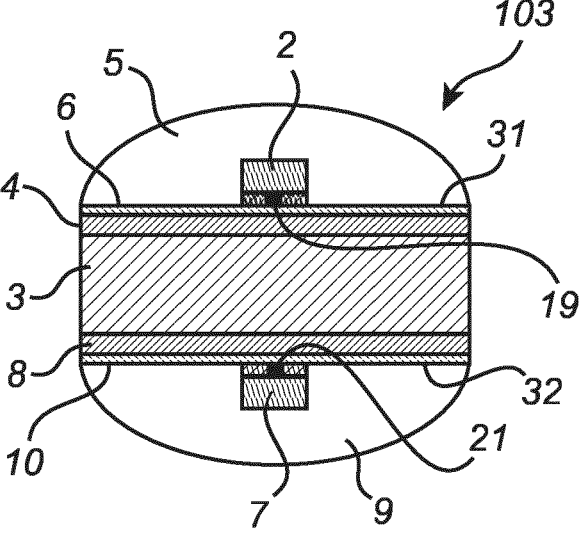
FIG. 6 shows a cross-sectional view of a LED filament according to a fifth embodiment of the invention.

FIG. 6 shows a cross-sectional view of a LED filament 103 according to a fifth embodiment of the invention. The LED filament 103 differs from the LED filaments described above in relation to FIGS. 1-4 in virtue of the following features.

The LED filament 103 comprises a further array of LEDs 7. The further array of LEDs 7 comprises a further plurality of LEDs configured to, in operation, emit further LED light. The further array of LEDs 7 is arranged on a further surface 32 of the elongated carrier 3. The further surface 32 extends in the embodiment shown opposite to and parallel with the surface 31 on which the array of LEDs 2 is arranged. Further electrical circuitry 21 is coupled to the further plurality of LEDs such as to supply the further plurality of LEDs with electrical energy. The further electrical circuitry 21 is separate from the at least partially reflective layer 4. The further electrical circuitry 21 may be arranged on or in the elongated carrier 3.

The LED filament 103 comprises a further reflective layer 8 configured to being perceived by a viewer as being golden in color. The further at least partially reflective layer 8 is partially transmissive or partially reflective or both for the further LED light. The further at least partially reflective layer 8 is configured to direct light away from the further array of LEDs 7.

The further at least partially reflective layer 8 is provided on the elongated carrier 3 below or underneath the further array of LEDs 7 and further below or underneath a further electrically insulating reflective layer 10. In other embodiments the electrically insulating reflective layer 10 may be omitted.

The LED filament 103 further comprises a further encapsulant 9 at least partially enclosing the further array of LEDs 7 and the elongated carrier 3. The further encapsulant 9 comprises a translucent material. The translucent material of the further encapsulant 9 may be a polymer, such as a silicone which is capable of withstanding high intensity light and heat.

In some embodiments, however, the further encapsulant 9 may in principle be omitted.

Figure 7:
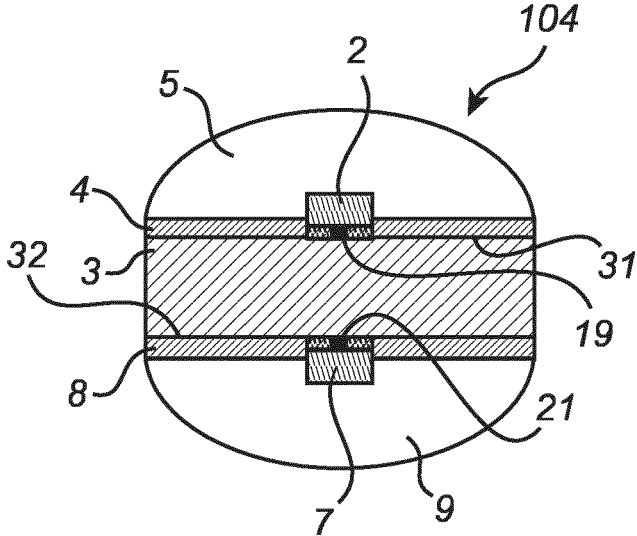
FIG. 7 shows a cross-sectional view of a LED filament according to a sixth embodiment of the invention.

FIG. 7 shows a cross-sectional view of a LED filament 104 according to a sixth embodiment of the invention. The LED filament 104 is very similar to the LED filament 103 shown in FIG. 6 but differs therefrom in virtue of the following feature.

The further at least partially reflective layer 8 is provided on a surface 32 of the elongated carrier 3 on both sides of the further array of LEDs 7.

The further encapsulant 9 may be similar or identical to any of the types of encapsulant 5 described above with reference to FIGS. 1-4. The further encapsulant 9 and the encapsulant 5 may be identical. The further encapsulant 9 and the encapsulant 5 may be in one piece. Alternatively, the further encapsulant 9 and the encapsulant 5 may be mutually different.

For instance, the further encapsulant 9 may comprise a luminescent material configured to at least partially convert the further LED light into converted further light. The further at least partially reflective layer 8 may then further be configured to at least partly transmit and/or at least partly reflect the converted further light.

Alternatively, the further encapsulant 9 may be free from a luminescent material. The further encapsulant 9 may then comprise a light scattering material configured to at least partially scatter the further LED light into scattered further light. In such an embodiment, the further at least partially reflective layer 8 may then be configured to at least partly transmit and/or at least partly reflect the scattered further light. The light scattering material of the further encapsulant 9 may for instance be scattering particles or a coating on the further encapsulant 9.

Figure 8:
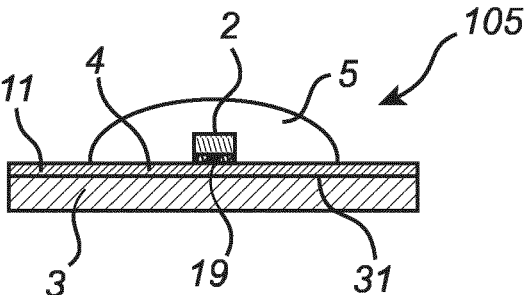
FIG. 8 shows a cross-sectional view of a LED filament according to a seventh embodiment of the invention.

FIG. 8 shows a cross-sectional view of a LED filament 105 according to a seventh embodiment of the invention. The LED filament 105 differs from the LED filaments described above in relation to FIGS. 1-4 and 6-7 in virtue of the following feature.

The encapsulant 5 only covers a part of the surface 31 of the elongated carrier 3, and thus only a part of the at least partially reflective layer 4. In other words, at least a part 11 of the at least partially reflective layer 4 is free from the encapsulant 5. For instance, at least 30%, at least 40% or at least 50% of the surface area of the at least partially reflective layer 4 may be free from the encapsulant 5.

If the light emitting device comprises a further encapsulant 9—cf. for instance FIGS. 6 and 7—embodiments in which the further encapsulant 9 only covers a part of the surface 32 of the elongated carrier 3, and thus only a part of the further at least partially reflective layer 8 are similarly feasible. In other words, at least a part of the further at least partially reflective layer 8 may be free from the further encapsulant 9. For instance, at least 30%, at least 40% or at least 50% of the surface area of the further at least partially reflective layer 8 may be free from the further encapsulant 9.

Figure 9:
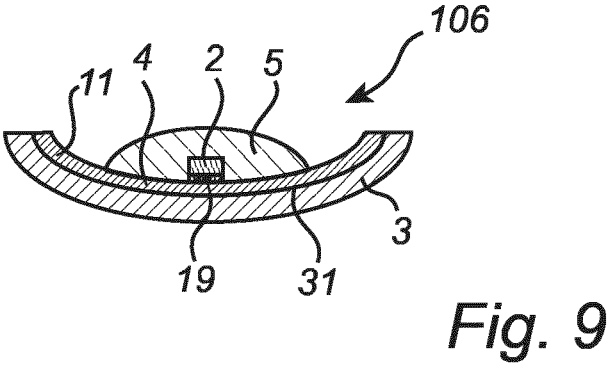
FIG. 9 shows a cross-sectional view of a LED filament according to an eighth embodiment of the invention.

FIG. 9 shows a cross-sectional view of a LED filament 106 according to an eighth embodiment of the invention. The LED filament 106 differs from the LED filaments described above in relation to FIGS. 1-4 and 6-8 in virtue of the following feature.

The elongated carrier 3 is a curved elongated carrier. The array of LEDs 2, the at least partially reflective layer 4 and, where provided, the encapsulant 5 is arranged on a concave surface 31 of the elongated carrier 3. Thereby, the curved elongated carrier 3 with the at least partially reflective layer 4 functions as a more efficient reflector. The curved elongated carrier may also be convex or a combination of concave and convex.

Figure 10:
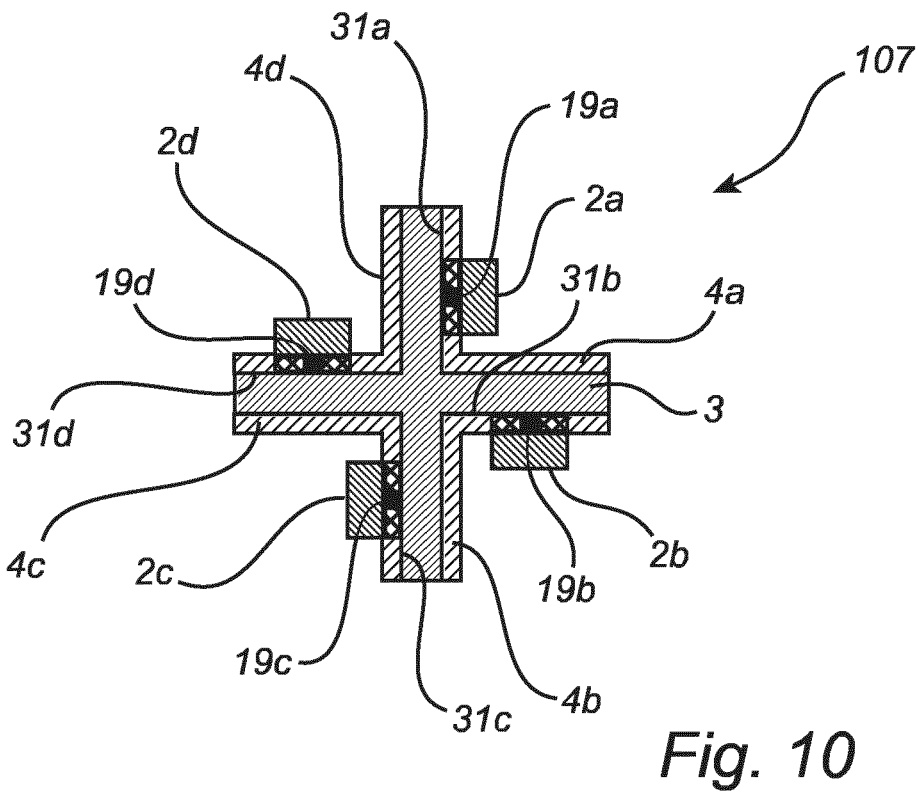
FIG. 10 shows a cross-sectional view of a LED filament according to a ninth embodiment of the invention.

FIG. 10 shows a cross-sectional view of a LED filament 107 according to a ninth embodiment of the invention. The LED filament 107 differs from the LED filaments described above in relation to FIGS. 1-4 and 6-9 in virtue of the following feature.

The elongated carrier 3 is generally provided with a plurality of surfaces 31, and on each of the surfaces 31 there is provided an array of LEDs 2 and a reflective layer 4. Thereby, even further improved reflection is obtained. In the exemplary embodiment shown on FIG. 10, the elongated carrier comprises four surfaces 31*a*, 31*b*, 31*c*, 31*d*. On each of the surfaces 31*a*, 31*b*, 31*c*, 31*d* an array of LEDs 2*a*, 2*b*, 2*c* and 2*d*, respectively, and a reflective layer 4*a*, 4*b*, 4*c* and 4*d*, respectively, is arranged. The respective array of LEDs 2*a*, 2*b*, 2*c* and 2*d* each comprise a plurality of LEDs. Electrical circuitry 19*a*, 19*b*, 19*c*, 19*d*, respectively, is coupled to the respective plurality of LEDs such as to supply the respective plurality of LEDs with electrical energy. The electrical circuitry 19*a*, 19*b*, 19*c*, 19*d* is separate from the respective at least partially reflective layer 4*a*, 4*b*, 4*c*, 4*d*. The electrical circuitry 19*a*, 19*b*, 19*c*, 19*d* may be arranged on or in the elongated carrier 3.

Figure 12:
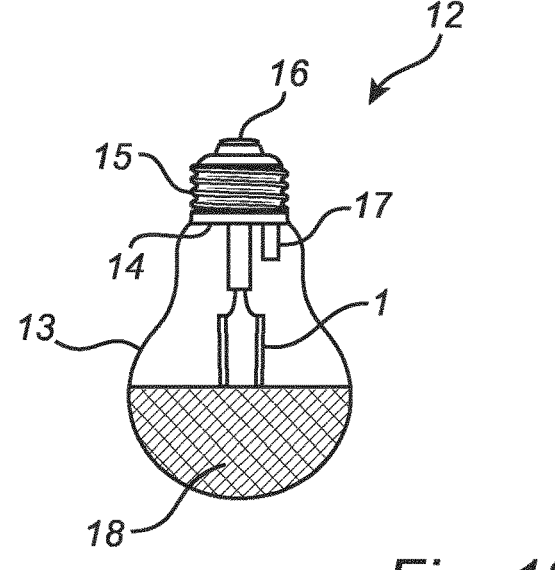
FIG. 12 shows a cross-sectional view of a lamp comprising a LED filament according to the invention.

FIG. 12 shows an exemplary lamp 12 comprising a LED filament 1 according to any embodiment of the invention. In the embodiment shown, the LED filament 1 is a substantially straight LED filament. The LED filament 1 of such a lamp may in other embodiments be a LED filament with another shape, such as, but not limited to, spiral-shaped, helix-shaped, meandering, twisted, flat and combinations thereof.

The lamp 12 further comprises a driver or controller 17 configured for controlling the LED filament light source of the LED filament 1. The controller 17 is configured to power the plurality of LEDs 20 via the electrical circuitry 21 of the LED filament 1. The controller 17 may further be configured for controlling at least one of the CCT of the LED filament light source light and the CRI of the LED filament light source light. The controller 17 may also be configured for controlling other parameters related to the LED filament light source and the LED filament light source light.

The lamp 12 further comprises an envelope 13 at least partially enveloping the at least one LED filament 1. The lamp 12 further comprises a cap 14. As shown on FIG. 12, the controller 17 is arranged within the envelope 13. When comprising a cap 14, the controller 17 may also be arranged inside the cap 14 such that it is hidden from view. The lamp 12 further comprises threading 15 for connection to a socket and a terminal 16 for connection to a source of electrical energy.

The envelope 13 of the lamp 12 may further and optionally be provided with a coating 18, such as a reflective coating, covering at least a part of the envelope 13.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting diode (LED) filament configured to, in operation, emit LED filament light, the LED filament comprising:

an array of light emitting diodes (LEDs) having a plurality of LEDs configured to, in operation, emit LED light, an electrical circuitry coupled to the plurality of LEDs, an elongated carrier, the plurality of LEDs being arranged on a first major surface of the elongated carrier, an encapsulant having a translucent material, the encapsulant at least partially enclosing the plurality of LEDs and the elongated carrier, the encapsulant having a luminescent material configured to at least partially convert the LED light into converted light, and an at least partially reflective layer, the at least partially reflective layer being:

configured to being perceived by a viewer as being golden in color, configured to partially transmit and partially reflect the LED light, and at least partially arranged on the same side of the carrier as the plurality of LEDs, and wherein the at least partially reflective layer is configured to partly transmit and/or partly reflect the converted light such that at least 60% of the converted light is transmitted through the at least partially reflective layer.

2. The LED filament according to claim 1, wherein at least 60% of the LED light is transmitted through the at least partially reflective layer.

3. The LED filament according to claim 1, wherein the at least partially reflective layer is configured to not conduct electricity or is electrically isolated from the electrical circuitry.

4. The LED filament according to claim 1, wherein the LED filament has a LED filament circumference, wherein at least 80% of the LED filament circumference is covered by the at least partially reflective layer.

5. The LED filament according to claim 1, wherein the LED filament further comprises:

a further array of light emitting diodes (LEDs) having a further plurality of LEDs configured to, in operation, emit further LED light, and a further electrical circuitry coupled to the further plurality of LEDs, the further plurality of LEDs being arranged on a second major surface of the elongated carrier opposite to the first major surface, and a further at least partially reflective layer, the further at least partially reflective layer being:

configured to being perceived by a viewer as being golden in color, configured to partially transmit and partially reflect the further LED light, and at least arranged on the same side of the elongated carrier as the further plurality of LEDs.

6. A LED filament lamp or luminaire comprising at least one LED filament according to claim 1 and a driver configured to power the plurality of LEDs of the LED filament via the circuitry of the LED filament.

7. The LED filament according to claim 1, wherein the at least partially reflective layer is provided any one or more of:

on the encapsulant, on a surface of the elongated carrier on which the plurality of LEDs is arranged covering at least 60% of the elongated carrier, on the same side of the elongated carrier as the plurality of LEDs and between the elongated carrier and an electrically insulating reflective layer covering at least 60% of the elongated carrier, on the elongated carrier around the plurality of LEDs covering at least 60% of the elongated carrier, and on or as a foil or tube arranged around the encapsulant.

8. The LED filament according to claim 1, wherein the elongated carrier is a transparent elongated carrier, and wherein a further at least partially reflective layer arranged on the opposite side of the elongated carrier as the plurality of LEDs, or wherein a further at least partially reflective layer is provided on a side or surface of the elongated carrier extending opposite to and parallel with the first major surface of the elongated carrier on which the plurality of LEDs is arranged.

9. The LED filament according to claim 1, wherein the at least partially reflective layer comprises a reflectivity of 30-50% for light with a wavelength of less than 490 nm, a reflectivity of more than 80% for light with a wavelength of more than 600 nm, and a reflectivity increasing gradually with the wavelength for light with a wavelength of between 490 nm and 600 nm.

10. The LED filament according to claim 1, wherein one or more of the following applies:

the surface of the LED filament comprises a reflection of less than 30%, at least 70% of the first major surface of the elongated carrier is covered by the at least partially reflective layer, the at least partially reflective layer is provided with a total reflectivity in the range of 20% to 60%, the at least partially reflective layer is provided as particles or flakes, in a polymer binder or a transparent polymer binder or a silicone, the at least partially reflective layer is provided by use of vapor deposition.

11. The LED filament according to claim 1, wherein a part of the elongated carrier is not covered by the encapsulant such as to ensure that at least a part of the at least partially reflective layer is free from the encapsulant.

12. The LED filament according to claim 11, wherein at least 40% of the surface area of the at least partially reflective layer is free from the encapsulant.

13. The LED filament according to claim 1, wherein the elongated carrier is curved.

14. A light emitting diode, LED, filament configured to, in operation, emit LED filament light, the LED filament comprising:

an array of light emitting diodes, LEDs, comprising a plurality of LEDs configured to, in operation, emit LED light, an electrical circuitry coupled to the plurality of LEDs, an elongated carrier, the plurality of LEDs being arranged on a first major surface of the elongated carrier, an encapsulant having a translucent material, the encapsulant at least partially enclosing the plurality of LEDs and the elongated carrier, the encapsulant being free from a luminescent material, the encapsulant having a light scattering material configured to at least partially scatter the LED light into scattered light, and an at least partially reflective layer, the at least partially reflective layer being:

configured to being perceived by a viewer as being golden in color, configured to partially transmit and partially reflect the LED light, and at least arranged on the same side of the carrier as the plurality of LEDs, and wherein the at least partially reflective layer is configured to partly transmit and/or partly reflect the scattered light such that at least 60% of the scattered light is transmitted through the at least partially reflective layer.

* * * * *